United States Patent [19]

Wolf et al.

[11] Patent Number: 5,464,159
[45] Date of Patent: Nov. 7, 1995

[54] METHOD FOR THE CONTAMINATION-FREE SIZE REDUCTION OF SEMICONDUCTOR MATERIAL, ESPECIALLY SILICON

[75] Inventors: Andreas Wolf, Burgkirchen; Franz Koeppl, Erlbach, both of Germany

[73] Assignee: Wacker-Chemitronic Gesellschaft für Elektronik-Grundstoffe mbH, Burghausen, Germany

[21] Appl. No.: 56,180

[22] Filed: May 3, 1993

[30] Foreign Application Priority Data

May 27, 1992 [DE] Germany ............... 42 18 283.2

[51] Int. Cl.⁶ ................... B02C 19/18
[52] U.S. Cl. .................. 241/1; 241/24
[58] Field of Search ............... 241/1, 24, 30, 241/5

[56] References Cited

U.S. PATENT DOCUMENTS

| | | | |
|---|---|---|---|
| 3,770,212 | 11/1973 | Kassir et al. | 241/1 |
| 4,313,573 | 2/1982 | Goldberger et al. | 241/1 |
| 4,424,199 | 1/1984 | Iya | 423/349 |
| 4,540,127 | 9/1985 | Andres | 241/1 |
| 4,565,913 | 1/1986 | Yatsurugi et al. | 219/10.55 M |
| 4,653,697 | 3/1987 | Codina | 241/1 |
| 4,691,866 | 9/1987 | Belk | 241/5 |
| 4,871,117 | 10/1989 | Baueregger et al. | 241/23 |

FOREIGN PATENT DOCUMENTS

| | | |
|---|---|---|
| 1423592 | 11/1965 | France . |
| 258186 | 7/1988 | German Dem. Rep. . |
| 2262178 | 1/1974 | Germany . |
| 3428255 | 2/1985 | Germany . |
| 3811091 | 10/1989 | Germany . |
| 1066848 | 4/1967 | United Kingdom . |
| 1284426 | 8/1972 | United Kingdom . |
| 2178337 | 2/1987 | United Kingdom . |

OTHER PUBLICATIONS

Derwent Abstract of DE 3428255, Feb. 21, 1985.
Derwent Abstract of DE 38 11 091, Oct. 12, 1989.
Derwent Abstract of DE 22 62 178, Jan. 24, 1974.

Primary Examiner—Mark Rosenbaum
Assistant Examiner—John M. Husar
Attorney, Agent, or Firm—Collard & Roe

[57] ABSTRACT

Bodies of hyperpure semiconductor material can be reduced in size without contamination by being subjected to shock waves. The method is preferably carried out at room temperature, so that diffusion into the interior of the semiconductor, which is induced and/or accelerated by high temperatures, is largely avoided for superficially adsorbed foreign particles. The shock waves are generated in a focal point of a semiellipsoidal reflector by electrical discharge between two electrodes.

5 Claims, No Drawings

METHOD FOR THE CONTAMINATION-FREE SIZE REDUCTION OF SEMICONDUCTOR MATERIAL, ESPECIALLY SILICON

BACKGROUND OF THE INVENTION

1. Field of the Invention

The present invention relates to a method for the contamination-free size reduction of semiconductor material, especially silicon.

2. The Prior Art

The production of solar cells or electronic components such as storage elements or microprocessors requires hyperpure semiconductor material. The specifically introduced dopants are the only impurities which a material of this type should contain. It is therefore desirable to keep the concentrations of harmful impurities as low as possible. It is often observed that semiconductor material, which had earlier been prepared in a hyperpure state, is later contaminated in the course of further processing to produce the end products. Thus, laborious purification steps become necessary in order to recover the original purity. Atoms of foreign metals, which are incorporated into the crystal lattice of the semiconductor material, interfere with the charge distribution. These foreign metals may reduce the function of the subsequent component or lead to the failure thereof. Consequently, contaminations of the semiconductor material by metallic impurities are particularly to be avoided. This applies especially to silicon, which in the electronics industry is the most commonly used semiconductor material.

Hyperpure silicon is obtained, for example, by thermal decomposition of silicon compounds which are highly volatile, such as trichlorosilane, and are therefore easily purified by distillation processes. In this process, the hyperpure silicon is obtained as polycrystalline rods having typical diameters of 70 to 300 mm and lengths of 500 to 2500 mm. A large proportion of the rods is used for the production of crucible-drawn single crystals or for producing strips and sheets, or for the production of polycrystalline solar-cell base material. Since these products are prepared from hyperpure, molten silicon, it is necessary to melt solid silicon in crucibles. In order to make this process as efficient as possible, large-volume, solid pieces of silicon such as these polycrystalline rods have to be reduced in size prior to melting. Conventionally, this is always associated with superficial contamination of the semiconductor material, because the size reduction is carried out with metallic crushing tools, such as jaw crushers, crushing mills, hammers or chisels.

Efforts are being made to reduce the size of semiconductor rods without contamination. Prior art attempts to do this are found in German published patent application No. 2,262,178 and German published application No. 3,811,091, and in German Patent No. 3,428,255, according to which thermal stresses are generated in the semiconductor rod. This is achieved, for example, by heating the rod to temperatures from 600° C. to 1,000° C. and subsequent cooling rapidly in water, or by heating parts of rods in a microwave oven. Such thermally generated stresses can result in direct size reduction of the semiconductor rod. These stresses can also weaken the rod to such an extent that further size reduction is then possible with less-contaminating crushing tools which are made of, for example, plastic or silicon.

High temperatures initiate and/or accelerate diffusion processes, which can be a detriment of the purity of the semiconductor material. This is because at least some of the superficial impurities, especially foreign metals, reach the interior of the rod or the fragments and elude cleaning processes at the surface. Moreover, thermal size reduction methods may require further use of mechanical size reduction tools if there was insufficient size reduction due to thermally generated stress. Further, thermal treatment is laborious and expensive when it is required to provide size reduction of fragments which still exceed a specified maximum limit size.

SUMMARY OF THE INVENTION

It is an object of the present invention to provide a method by which semiconductor material, especially silicon, can be reduced in size without contamination so as to dispense with high temperatures and mechanical crushing tools, which method is also applicable to fragments of any size and shape.

This object is achieved by a method for the contamination-free size reduction of semiconductor material, especially silicon, wherein the semiconductor material is subjected to shock waves.

It is possible to achieve contamination-free size reduction of hard-brittle semiconductor material such as silicon with the aid of shock waves. The size reduction tool is a conventional generator for generating shock waves and is at no time in direct contact with the semiconductor material. The shock waves are transmitted from their point of origin by a liquid medium, preferably degassed water of the very highest purity.

Shock waves can be generated, for example, by explosive charges, electrical discharges, electromechanically, or piezoelectrically. Preferably, the shock waves are generated by the electrical discharge between two electrodes in the focal point of a semiellipsoidal reflector. The plasma formed during the discharge between the electrodes results in a spherical shock wave front propagating in the transmission medium with the velocity of sound. The shock wave front is reflected by the walls of the reflector and is focused in the focal point of an imaginary semiellipsoidal disposed mirror-like symmetrical reflector. This focal point is surrounded by the focusing region of the semiellipsoidal reflector.

Advantageously, a size reduction chamber is filled with water, such as a water tank into which the semiconductor material, whose size is to be reduced, is introduced. The shock waves are transmitted into the size reduction chamber. The semiellipsoidal reflector may be positioned in the size reduction chamber or it can be mounted on one of the boundary faces thereof. In another embodiment, the site of the shock wave generation is spatially separated from the semiconductor material by a membrane, which is impermeable to foreign substances and which transmits shock waves, in order to protect the semiconductor material against contamination.

The semiconductor material is reduced in size by absorbing part of the energy transmitted along with the shock wave front. The more energy used for generating the shock waves and the more closely matched the position of the semiconductor material and the site where the shock waves are focused, the more effective the size reduction. It is therefore desirable, though by no means mandatory (even non-focused shock waves have a size-reducing effect on semiconductor material) to position the semiconductor material, whose size is to be reduced, in the focusing region of the semiellipsoidal reflector. In principle, it is possible to move the semiconductor material itself or, alternatively, to move the semiellipsoidal reflector. A further parameter affecting the efficiency of the size reduction method according to the invention is the frequency at which successive shock wave fronts are generated. If the discharge energies are high, longer intervals between the shock wave-generating discharges must be expected than in the case of lower energies. It is therefore another object to provide for process optimization by coordinating the discharge energies and the discharge frequencies with the intended size reduction that is desired.

Advantageously, the semiconductor material is subjected to the shock waves until the fragments have reached a desired limiting size or are smaller in size than the limiting size. Preferably, the size reduction of the semiconductor material is carried out at low temperatures, especially room temperature. Thus, diffusion, induced and/or accelerated by high temperatures, is largely avoided for superficially adsorbed foreign substances, especially foreign metals.

In order to avoid contamination, the working surfaces of the tools for conveying and positioning the semiconductor material are preferably made of plastic, for example, polyethylene (PE), polytetrafluoroethylene (PTFE) or polyvinylidenedifluoride (PVDF), or are made of the same material as that being reduced in size. Similarly, it has been found to be useful to line the inner surfaces of the size reduction chamber with plastic.

In a preferred embodiment of the method according to the invention, steps are taken to keep fragments in the focusing region of the semiellipsoidal reflector, as long as they are still larger than the size defined by the limiting size. This can be achieved, for example, by packaging the semiconductor material in plastic netting and keeping it in the target area of the shock waves. Small fragments generated are able to drop through the meshes of the net. These fragments are preferably collected in containers of non-contaminating materials and are transported from the size reduction chamber.

In a further embodiment of the method according to the invention, the semiellipsoidal reflector is mounted so as to be movable in two or three spatial directions. Thus, the focusing region of the semiellipsoidal reflector can be realigned relative to the semiconductor material to be reduced in size. Fragments whose size drops below the limiting size are separated, for example, via a screen made of a non-contaminating material, from semiconductor material whose size is yet to be reduced. By means of an optical target recognition system and a computer, it is possible to automate the semiconductor size reduction in a further development stage of this embodiment of the method.

In a further embodiment of the method according to the invention, the shock wave energy is transmitted to the semiconductor material via a water cushion. In this case, the size reduction of semiconductor bodies does not necessarily have to take place under water. It is sufficient, for example, to position a water-filled plastic hose, as the shock wave transmitter, between the section plane of the water-filled semiellipsoidal reflector and the semiconductor surface. They are sealed in a liquid-tight manner and are in contact with each other. This has the particular advantage that it can be carried out in a clean room or alternatively under protective gas atmosphere, so that the risk of contaminating the semiconductor material during size reduction is further diminished.

The size reduction method according to the invention is not limited to polycrystalline silicon rods. In principle, solid, large-volume semiconductor bodies, preferably of monocrystalline or polycrystalline silicon, can be reduced in size. Suitable equipment for producing shock waves is known in the art, for example, medical lithotripters.

The method according to the invention makes it possible to reduce the size of semiconductor material, especially silicon, at low temperatures and without contact by a crushing tool. The size reduction is achieved without contamination of the semiconductor material and without the diffusion of superficially adsorbed foreign substances, especially foreign metals, into the interior of the fragments. The low temperature prevents diffusion, which is initiated and/or accelerated by high temperatures. If the semiconductor material to be reduced in size is not surface contaminated, it is possible to dispense with surface cleaning of the fragments by etching.

DETAILED DESCRIPTION OF THE PREFERRED EMBODIMENT

Other objects and features of the present invention will become apparent from the following detailed description considered in connection with the accompanying example which discloses one embodiment of the present invention. It should be understood, however, that the example is designed for the purpose of illustration only and not as a definition of the limits of the invention.

EXAMPLE

Polycrystalline pieces of silicon rod from a deposition plant were completely immersed in a water-filled tank. Their position in the tank was selected in such a way that it corresponded, at least approximately, to the focusing region of a semiellipsoidal reflector. The semiellipsoidal reflector, in whose focal point the shock waves were generated via electrical discharges between two electrodes, was attached to a lateral wall of the water tank by flanges. The energy consumption during the shock wave generation was 400 Joule per discharge. The discharges were carried out at a frequency of 0.5 to 3 Hz and were maintained for from several seconds up to ten minutes. The rod pieces subjected to the shock waves had diameters of 100 to 150 mm and lengths of 200 to 500 mm. Depending on duration and energy input, the treatment resulted in fragments of varying sizes.

While only a single embodiment of the present invention has been shown and described, it is to be understood that many changes and modifications may be made thereunto without departing from the spirit and scope of the invention as defined in the appended claims.

What is claimed is:

1. A method for the contamination-free size reduction of silicon material comprising:

positioning the silicon material in a focusing region of a semiellipsoidal reflector;

said focusing region being disposed opposite a focal point of the semiellipsoidal reflector; and subjecting the silicon material to focused shock waves which are generated in said focal point of said semiellipsoidal reflector and transmitted in a liquid medium to the silicon material positioned in said focusing region of said semi-ellipsoidal reflector.

2. The method as claimed in claim 1, comprising:

transmitting the shock waves in water.

3. The method as claimed in claim 1, comprising:

generating the shock waves by electrical discharge between two electrodes.

4. The method as claimed in claim 1, comprising:

separating the silicon material from the focal point of the semi-ellipsoidal reflector by a membrane which is impermeable to foreign substances.

5. The method as claimed in claim 1, comprising:

subjecting the silicon material to focused shock waves until said silicon material is comminuted to fragments having reached a limiting size or being smaller than said limiting size.

* * * * *